US011292728B2

(12) United States Patent
Matsushita et al.

(10) Patent No.: US 11,292,728 B2
(45) Date of Patent: Apr. 5, 2022

(54) LIGHT-ABSORBING MATERIAL, METHOD FOR PRODUCING THE SAME, AND SOLAR CELL INCLUDING THE SAME

(71) Applicant: Panasonic Intellectual Property Management Co., Ltd., Osaka (JP)

(72) Inventors: Akio Matsushita, Ibaraki (JP); Hiroko Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 346 days.

(21) Appl. No.: 16/416,253

(22) Filed: May 19, 2019

(65) Prior Publication Data

US 2019/0270648 A1     Sep. 5, 2019

Related U.S. Application Data

(63) Continuation of application No. 15/887,993, filed on Feb. 3, 2018, now abandoned.

(30) Foreign Application Priority Data

Feb. 10, 2017 (JP) .............................. JP2017-022948

(51) Int. Cl.
*C01G 17/00* (2006.01)
*H01L 51/42* (2006.01)
*H01G 9/20* (2006.01)

(52) U.S. Cl.
CPC ............. *C01G 17/006* (2013.01); *H01G 9/20* (2013.01); *H01L 51/4213* (2013.01);
(Continued)

(58) Field of Classification Search
None
See application file for complete search history.

(56) References Cited

U.S. PATENT DOCUMENTS

| 5,882,548 A | 3/1999 | Liang et al. |
| 2015/0340632 A1 | 11/2015 | Etgar |

(Continued)

FOREIGN PATENT DOCUMENTS

| CN | 103943368 | 7/2014 |
| JP | 10-316685 | 12/1998 |

(Continued)

OTHER PUBLICATIONS

Jeong-Hyeok Im et al., "Growth of CH3NH3PbI3 cuboids with controlled size for high-efficiency perovskite solar cells", Mature Nanotechnology, vol. 9, Aug. 31, 2014, pp. 927-932.

(Continued)

*Primary Examiner* — Eli S Mekhlin
(74) *Attorney, Agent, or Firm* — Renner, Otto, Boisselle & Sklar, LLP

(57) ABSTRACT

A light-absorbing material includes a compound, wherein the compound has a perovskite crystal structure represented by the formula $AMX_3$ where a $Cs^+$ ion is located at an A-site, a $Ge^{2+}$ ion is located at an M-site, and $I^-$ ions are located at X-sites, and at least a part of the compound has an orthorhombic perovskite crystal structure. An X-ray diffraction pattern of the compound measured using Cu Kα radiation may have a first peak at a diffraction angle (2θ) of 25.4° or more and 25.8° or less and a second peak at a diffraction angle (2θ) of 24.9° or more and 25.3° or less, and an intensity of the first peak may be 30% or more of an intensity of the second peak.

6 Claims, 3 Drawing Sheets

(52) U.S. Cl.
CPC ...... *H01L 51/4226* (2013.01); *C01P 2002/34* (2013.01); *C01P 2002/72* (2013.01); *C01P 2002/82* (2013.01); *C01P 2006/40* (2013.01); *Y02E 10/549* (2013.01); *Y02P 70/50* (2015.11)

(56) References Cited

U.S. PATENT DOCUMENTS

2017/0018371 A1    1/2017   Suzuka et al.
2018/0096797 A1    4/2018   Satou et al.

FOREIGN PATENT DOCUMENTS

| | | |
|---|---|---|
| JP | 2014-056962 | 3/2014 |
| JP | 2016-502282 | 1/2016 |
| JP | 2017-022354 | 1/2017 |
| WO | 2016/043001 | 3/2016 |
| WO | 2016/208578 A1 | 12/2016 |

OTHER PUBLICATIONS

Thirumal Krishnamoorthy et al., "Lead-free germanium iodide perovskite materials for photovoltaic applications", Journal of Materials Chemistry A, 2015, vol. 3, Oct. 16, 2015, pp. 23829-23832.

LIGHT-ABSORBING MATERIAL, METHOD FOR PRODUCING THE SAME, AND SOLAR CELL INCLUDING THE SAME

This application is a continuation of U.S. patent application Ser. No. 15/887,993 filed Feb. 3, 2018, which claims priority to Japanese Patent Application No. 2017-022948 filed Feb. 10, 2017, the disclosures of which are incorporated herein by reference.

BACKGROUND

1. Technical Field

The present disclosure relates to a light-absorbing material having a perovskite crystal structure, a method for producing the light-absorbing material, and a solar cell containing the light-absorbing material.

2. Description of the Related Art

In recent years, solar cells containing a compound (hereinafter referred to as "perovskite-type compound") having a perovskite crystal structure represented by the formula $AMX_3$ or a similar crystal structure as a light-absorbing material have been being developed. In the perovskite-type compound, a monovalent cation is located at an A-site, a divalent metal cation is located at an M-site, and halogen anions are located at X-sites.

A perovskite-type compound-containing solar cell (hereinafter referred to as "perovskite solar cell") is one of candidates for low-cost, high-efficiency next-generation solar cells and is being developed.

From the viewpoint of environmental regulation, the following compound is known as a lead-free perovskite-type compound: a perovskite-type compound in which a $Cs^+$ ion (cesium cation) is located at an A-site, a $Ge^{2+}$ ion (germanium cation) is located at an M-site, and $I^-$ ions are located at X-sites (see, for example, Chinese Examined Patent Application Publication No. 103943368 and Thirumal Krishnamoorthy et al., *Journal of Materials Chemistry A*, vol. 3 (October, 2015), pp. 23829-23832 (hereinafter referred to as "Non-patent Document 1")).

SUMMARY

In order to increase the conversion efficiency of perovskite solar cells, a light-absorbing material capable of achieving high conversion efficiency at sunlight wavelengths is demanded.

One non-limiting and exemplary embodiment provides a light-absorbing material which contains no lead and which is capable of achieving high conversion efficiency at sunlight wavelengths.

In one general aspect, the techniques disclosed here feature a light-absorbing material containing a compound. The compound has a perovskite crystal structure represented by the formula $AMX_3$ where a $Cs^+$ ion is located at an A-site, a $Ge^{2+}$ ion is located at an M-site, and $I^-$ ions are located at X-sites. At least a part of the compound has an orthorhombic perovskite crystal structure.

It should be noted that general or specific embodiments may be implemented as an element, a device, a module, a system, an integrated circuit, or a method. It should be noted that the general or specific embodiments may be implemented as any selective combination of an element, a device, a module, a system, an integrated circuit, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
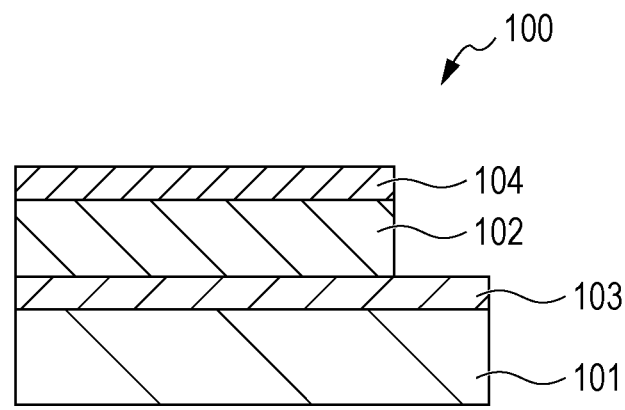
FIG. 1 is a schematic sectional view of a solar cell containing a light-absorbing material according to an embodiment of the present disclosure.

Underlying knowledge forming the basis of the present disclosure is as described below.

It is known that the performance of a light-absorbing material for solar cells depends on the band gap thereof. Details are described in William Shockley et al., *Journal of Applied Physics*, vol. 32, no. 3 (March, 1961), pp. 510-519. The limit of conversion efficiency is known as the Shockley-Queisser limit. When the band gap of the light-absorbing material is 1.4 eV, the theoretical conversion efficiency thereof is highest. When the band gap of the light-absorbing material is larger than 1.4 eV, a high open-circuit voltage is obtained and the short-circuit current is, however, reduced by a reduction in absorption wavelength. In contrast, when the band gap of the light-absorbing material is smaller than 1.4 eV, the short-circuit current is increased by an increase in absorption wavelength and the open-circuit voltage is, however, reduced.

The band gap of a perovskite-type compound ($CsGeI_3$) described in Non-patent Document 1 is about 1.6 eV and is unequal to 1.4 eV, at which the theoretical conversion efficiency thereof peaks. When the perovskite-type compound is contained in a solar cell, there is a problem in that high conversion efficiency is not obtained because light with a wavelength of more than 780 nm cannot be used.

The inventor has investigated a process for synthesizing $CsGeI_3$ and the crystal structure of $CsGeI_3$. As a result, the inventor has found that $CsGeI_3$ described in Non-patent Document is rhombohedral and can be reduced in band gap by converting at least a part of $CsGeI_3$ into an orthorhombic crystal. On the basis of this finding, the inventor has found a light-absorbing material capable of achieving higher conversion efficiency than ever before at long wavelengths, thereby completing the present disclosure.

The present disclosure is based on the above findings and is as summarized below.

A light-absorbing material according to an aspect of the present disclosure includes a compound. The compound has a perovskite crystal structure represented by the formula $AMX_3$ where a $Cs^+$ ion is located at an A-site, a $Ge^{2+}$ ion is located at an M-site, and I⁻ ions are located at X-sites. At least a part of the compound has an orthorhombic perovskite crystal structure.

An X-ray diffraction pattern of the compound measured using Cu Kα radiation may have a first peak at a diffraction angle (2θ) of 25.4° or more and 25.8° or less and a second peak at a diffraction angle (2θ) of 24.9° or more and 25.3° or less. An intensity of the first peak may be 30% or more of an intensity of the second peak.

The compound may have a band gap of, for example, 1.35 eV or more and 1.53 eV or less.

The compound may have a band gap of, for example, 1.45 eV or more and 1.48 eV or less.

A solar cell according to an aspect of the present disclosure includes: a first electrode having electrical conductivity; a second electrode having electrical conductivity; and a light-absorbing layer between the first electrode and the second electrode, the light-absorbing layer converting incident light into electric charge. The light-absorbing layer contains the light-absorbing material.

A method for producing a light-absorbing material according to an aspect of the present disclosure, the light-absorbing material including a compound having a perovskite crystal structure represented by the formula $AMX_3$ where a $Cs^+$ ion is located at an A-site, a $Ge^{2+}$ ion is located at an M-site, and I⁻ ions are located at X-sites. The method includes: (A) preparing a first solution containing $Ge^{2+}$ ions and I⁻ ions; (B) preparing a second solution containing $Cs^+$ ions; and (C) precipitating the compound by introducing the second solution into the first solution adjusted to a predetermined temperature.

The (B) may include preparing the second solution by dissolving, for example, a Cs source in an organic solvent.

The (A) may include preparing the first solution by mixing, for example, a Ge source, hydriodic acid, and phosphinic acid.

The Ge source may be, for example, germanium diiodide. The predetermined temperature may be, for example, 50° C. or more and 100° C. or less.

The Ge source may be, for example, germanium oxide. The predetermined temperature may be, for example, 20° C. or more and 50° C. or less.

The (A) may include preparing, for example, a third solution by dissolving the Ge source in an organic solvent and preparing the first solution by mixing the third solution with a liquid mixture containing the hydriodic acid and the phosphinic acid.

Embodiments

A light-absorbing material according to an embodiment of the present disclosure contains a perovskite-type compound. The perovskite-type compound in this embodiment contains a compound which has a perovskite crystal structure represented by the formula $AMX_3$ where a $Cs^+$ ion is located at an A-site, a $Ge^{2+}$ ion is located at an M-site, and I⁻ ions are located at X-sites.

An X-ray diffraction pattern of the perovskite-type compound measured using Cu Kα radiation in this embodiment has a first peak located at a diffraction angle (2θ) of 25.4° or more and 25.8° or less and a second peak located at a diffraction angle (2θ) of 24.9° or more and 25.3° or less. The first peak is assigned to the (111) plane of orthorhombic $CsGeI_3$ and is a peak detected when $CsGeI_3$ which is an orthorhombic perovskite-type compound is contained. The second peak is assigned to the (111) plane of rhombohedral $CsGeI_3$ and is a peak detected when $CsGeI_3$ which is a rhombohedral perovskite-type compound is contained. That is, the perovskite-type compound in this embodiment is in such a state that orthorhombic $CsGeI_3$ and rhombohedral $CsGeI_3$ are mixed.

As described above, a perovskite-type compound, $CsGeI_3$, described in Non-patent Document 1 is rhombohedral and has a band gap of about 1.60 eV. On the other hand, the perovskite-type compound in this embodiment contains orthorhombic $CsGeI_3$ in addition to rhombohedral $CsGeI_3$. This allows the perovskite-type compound in this embodiment to have a band gap smaller than that of a perovskite-type compound composed of only rhombohedral $CsGeI_3$.

The proportion of the intensity of the first peak to the intensity of the second peak is, for example, 30% or more. The term "intensity of peak" as used herein refers to the maximum of a peak. The fact that the intensity of the first peak is 30% or more of the intensity of the second peak allows the band gap to be sufficiently small. The intensity of the first peak may be 60% or more of the intensity of the second peak. The upper limit of the proportion of the intensity of the first peak to the intensity of the second peak is not particularly limited. The intensity of the first peak may be greater than the intensity of the second peak. In the case of producing a perovskite-type compound by a method below, the intensity of a first peak of an X-ray diffraction pattern of the perovskite-type compound may be, for example, 30% or more and 100% or less of that of a second peak thereof.

According to investigations carried out by the inventors, as the proportion of orthorhombic $CsGeI_3$ in a perovskite-type compound is higher, a smaller band gap can be obtained. Thus, most of the perovskite-type compound in this embodiment may be orthorhombic $CsGeI_3$. Alternatively, the perovskite-type compound in this embodiment may be substantially composed of orthorhombic $CsGeI_3$ only. When the perovskite-type compound in this embodiment is composed of orthorhombic $CsGeI_3$ only, an X-ray diffraction pattern of the perovskite-type compound has no second peak. Such a perovskite-type compound can be produced in such a manner that, for example, orthorhombic $CsGeI_3$ is taken from a perovskite-type compound produced by a method below and is then grown.

The band gap of the perovskite-type compound in this embodiment is desirably, for example, 1.30 eV or more and less than 1.60 eV, more desirably 1.35 eV or more and 1.53 eV or less, and further more desirably 1.45 eV or more and 1.48 eV or less. The magnitude of the band gap thereof may vary depending on a method and conditions for producing the perovskite-type compound.

The perovskite-type compound in this embodiment may mainly contain $CsGeI_3$ and may further contain a trace amount of another element. $CsGeI_3$ contains a $Cs^+$ ion as a cation located at an A-site and may further contain, for example, 5 mol % or less of another cation. Examples of the other cation include organic cations such as a $CH_3NH_3^+$ ion and a $(NH_2)_2CH^+$ ion and alkali metal cations such as an $Rb^+$ ion. $CsGeI_3$ contains I⁻ ions as halogen anions located at X-sites and may further contain, for example, 5 mol % or less of another halogen anion such as a $Br^-$ ion or a $Cl^-$ ion.

Method for Producing Light-Absorbing Material

An example of a method for producing the light-absorbing material according to this embodiment is described below.

First, a Ge-containing solution containing a Ge source, hydriodic acid, and phosphinic acid (reducing agent) is prepared. The Ge source may be a material soluble in a liquid mixture of hydriodic acid and phosphinic acid. The examples of the Ge source may include germanium diiodide ($GeI_2$), germanium tetraiodide ($GeI_4$), and germanium oxide ($GeO_2$). The Ge source solution is obtained in such a manner that, for example, the Ge source or a Ge source solution containing the Ge source is introduced into the liquid mixture of hydriodic acid and phosphinic acid, followed by heating. The heating temperature may be, for example, 50° C. or more and 100° C. or less. The Ge-containing solution may be a solution containing $Ge^{2+}$ ions and $I^-$ ions. A method for preparing the Ge-containing solution is not limited to the above.

The Ge source solution is prepared by dissolving the Ge source in an organic solvent. The examples of the organic solvent may include dimethyl sulfoxide, and N,N-dimethylformamide.

A Cs source solution containing $Cs^+$ ions is prepared. The Cs source solution is prepared, for example, by dissolving the Cs source in an organic solvent. The Cs source may be a material soluble in the organic solvent. The examples of the Cs source may include cesium iodide (CsI). The examples of the organic solvent may include, for example, dimethyl sulfoxide, and N,N-dimethylformamide.

Next, the temperature of the Ge-containing solution is adjusted to a first temperature, followed by introducing the Cs source solution into the Ge-containing solution. A mixture of the Ge-containing solution and the Cs source solution may be maintained at the first temperature as required. This precipitates a perovskite-type compound ($CsGeI_3$) in the mixture thereof.

Controlling the temperature of the Ge-containing solution to the first temperature before the Cs source solution is introduced into the Ge-containing solution allows $CsGeI_3$ to be obtained in such a state that an orthorhombic crystal and a rhombohedral crystal are mixed. The desirable range of the first temperature varies depending on the Ge source. When germanium diiodide ($GeI_2$) is used as the Ge source, the first temperature may be 50° C. or more and 100° C. or less. When germanium oxide ($GeO_2$) is used as the Ge source, the first temperature may be 20° C. (room temperature) or more and 50° C. or less. Controlling the temperature of the Ge-containing solution within the above range enables the rate of reaction to be adjusted within such a range that $CsGeI_3$ can be obtained in such a state that the orthorhombic crystal and the rhombohedral crystal are mixed.

In a method for producing $CsGeI_3$ described in Non-patent Document 1, a Ge source ($GeO_2$) in a powder state and a Cs source (CsI) in a powder state are dissolved in the Ge-containing solution in that order. According to this method, the rate of reaction is high because powdery sources are mixed. When the rate of reaction is high, a material with a higher production rate is preferentially produced. That is, it is conceivable that rhombohedral $CsGeI_3$, which is more likely to be produced than orthorhombic $CsGeI_3$, is mainly formed. However, in this embodiment, a solution is prepared by dissolving the Cs source in the organic solvent and is then mixed with the Ge-containing solution. Therefore, the rate of reaction can be suppressed to a low level; hence, not only rhombohedral $CsGeI_3$ but also orthorhombic $CsGeI_3$ are produced.

The method for producing the light-absorbing material is not limited to the above-mentioned method. A perovskite-type compound containing rhombohedral $CsGeI_3$ and orthorhombic $CsGeI_3$ can be precipitated by mixing $Ge^{2+}$ ions, $I^-$ ions, and $Cs^+$ ions under such conditions that the rate of reaction is low.

Solar Cell

A solar cell 100 containing the light-absorbing material according to an embodiment of the present disclosure is described below.

FIG. 1 is a schematic sectional view of the solar cell 100, which contains the light-absorbing material according to an embodiment of the present disclosure.

The solar cell 100 includes a substrate 101, a first electrode 103, a light-absorbing layer 102, and a second electrode 104, the first electrode 103, the light-absorbing layer 102, and the second electrode 104 being stacked on the substrate 101 in that order.

The light-absorbing layer 102 is a layer converting incident light into electric charge. The light-absorbing layer 102 contains the light-absorbing material.

In the solar cell 100, when light is applied to the light-absorbing layer 102 from the outside, the light-absorbing layer 102 absorbs light to generate electrons and holes. The electrons and holes generated in the light-absorbing layer 102 are output to the outside through the first electrode 103 and the second electrode 104, respectively.

The substrate 101 has a function to physically support the light-absorbing layer 102, the first electrode 103, and the second electrode 104. The substrate 101 may be made of, for example, a transparent material or an opaque material. Examples of the transparent material include glass and transparent plastics. Examples of the opaque material include metals, ceramics, and opaque plastics. When the substrate 101 is made of the transparent material, electricity can be obtained by irradiating the light-absorbing layer 102 with sunlight passing through the substrate 101.

When one or both of the first electrode 103 and the second electrode 104 have sufficient strength, the substrate 101 can be omitted. Referring to FIG. 1, the substrate 101 is placed in contact with the first electrode 103. The substrate 101 may be placed in contact with the second electrode 104.

The first electrode 103 and the second electrode 104 may be made of an electrically conductive material. Examples of the electrically conductive material include metals, transparent metal oxides, and carbon materials. Examples of the metals include gold, silver, copper, platinum, aluminium, titanium, nickel, tin, zinc, and chromium. Examples of the transparent metal oxides include indium-tin composite oxides, antimony-doped tin oxides, fluorine-doped tin oxides, and zinc oxides doped with boron, aluminium, gallium, and/or indium. Examples of the carbon materials include graphenes, carbon nanotubes, and graphite.

One or both of the first electrode 103 and the second electrode 104 desirably have light transmissivity in the visible-to-near infrared range. Even when either one of the first electrode 103 and the second electrode 104 is made of an opaque material such as metal or a carbon material, light transmissivity can be ensured by forming a pattern for transmitting light. The pattern for transmitting light may be a grid, linear, or wavy pattern.

When the first electrode 103 and the second electrode 104 have light transmissivity, the transmittance thereof is desirably high. The transmittance thereof is, for example, 50% or more and is desirably 80% or more. The wavelength range of transmitted light is desirably wider than the absorption wavelength range of the light-absorbing material, which is contained in the light-absorbing layer 102.

Figure 2:
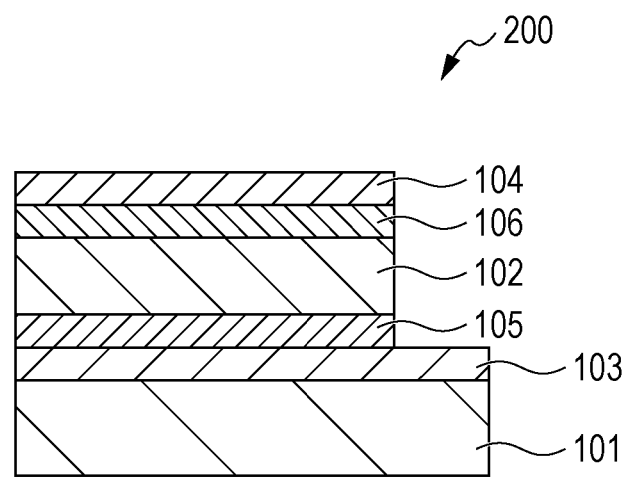
FIG. 2 is a schematic sectional view of another solar cell containing the light-absorbing material.

FIG. 2 is a schematic sectional view of another solar cell 200 containing the light-absorbing material.

As shown in FIG. 2, an electron transport layer 105 may be placed between a light-absorbing layer 102 and a first electrode 103. The presence of the electron transport layer 105 enables the efficiency of extracting electrons from the first electrode 103 to be increased. The electron transport layer 105 is typically composed of a semiconductor material.

Examples of the semiconductor material used in the electron transport layer 105 include metal oxide materials and organic n-type semiconductor materials. Examples of the metal oxide materials include titanium oxide, tin oxide, zinc oxide, and indium oxide. Examples of the organic n-type semiconductor materials include imide compounds, quinone compounds, fullerenes, and derivatives thereof.

A hole transport layer 106 may be placed between the light-absorbing layer 102 and a second electrode 104. The presence of the hole transport layer 106 enables the efficiency of extracting holes from the second electrode 104 to be increased. The hole transport layer 106 is typically composed of a semiconductor material.

Examples of the semiconductor material used in the hole transport layer 106 include inorganic p-type semiconductor materials and organic p-type semiconductor materials. Examples of the inorganic p-type semiconductor materials include CuO, $Cu_2O$, CuSCN, molybdenum oxide, and nickel oxide. Examples of the organic p-type semiconductor materials include phenylamine, triphenylamine derivatives containing a tertiary amine in the framework thereof, and PEDOT compounds having a thiophene structure.

The solar cell 100 can be manufactured by, for example, a method below.

First, the first electrode 103 is formed on the substrate 101. A physical vapor deposition process or a chemical vapor deposition process can be used to form the first electrode 103. Examples of the physical vapor deposition process include a sputtering process, a resistive heating evaporation process, and an electron beam evaporation process. Examples of the chemical vapor deposition process include a thermal chemical vapor deposition process, a plasma-enhanced chemical vapor deposition process, and an atomic layer deposition process.

Next, the light-absorbing layer 102 is formed on the first electrode 103. The light-absorbing layer 102 is formed by coating the first electrode 103 with a liquid (coating solution) containing the light-absorbing material. The coating solution can be prepared by mixing, for example, the perovskite-type compound ($CsGeI_3$) prepared by the above-mentioned method with a solvent. The solvent may be one that does not decompose the perovskite-type compound $CsGeI_3$. Examples of a solvent that does not decompose $CsGeI_3$ include toluene and water. Examples of a coating process include a spin coating process, a die coating process, an ink jet process, and a blade coating process.

Subsequently, the second electrode 104 is formed on the light-absorbing layer 102. A technique similar to a process for preparing the first electrode 103 can be used to prepare the second electrode 104. A process that does not damage the light-absorbing layer 102 may be appropriately selected from the above processes.

Example

A compound of Example 1 and a compound of Comparative Example 1 were prepared and were examined for crystal structure and band gap. In Example 1, a perovskite-type compound ($CsGeI_3$) was prepared by mixing a solution of a Cs source with a Ge-containing solution. In Comparative Example 1, a perovskite-type compound was prepared by mixing a powder of the Cs source with the Ge-containing solution, similarly to a method described in Non-patent Document 1.

A method for preparing the compound of Example 1, a method for preparing the compound of Comparative Example 1, and analysis results thereof are described below.

Method for Preparing Compound of Example 1

First, germanium diiodide ($GeI_2$) was dissolved in a solvent prepared by mixing N,N-dimethylformamide (DMF) and dimethyl sulfoxide (DMSO) at a ratio of 4:1 so as to give a concentration of 1 mol/L, whereby a Ge source solution was obtained.

Furthermore, a Cs source solution was prepared in such a manner that cesium iodide (CsI) was dissolved in dimethyl sulfoxide (DMSO) so as to give a concentration of 1 mol/L.

Next, the Ge source solution, a hydriodic acid solution (a concentration of 55%), and a phosphinic acid solution (a concentration of 33%) were mixed at a volume ratio of 4:4:1. The mixture was heated to 100° C. with a hotplate, whereby the Ge-containing solution was prepared.

Subsequently, the Cs source solution was added dropwise to the Ge-containing solution heated to 100° C. The mixing ratio of the Cs source solution to the Ge-containing solution was 1:9. After the Cs source solution was added dropwise to the Ge-containing solution, this mixture was left for about 15 minutes in such a state that this mixture was heated at 100° C., whereby black particles were precipitated in a liquid. The particles were washed with ethanol and were then dried, whereby the compound of Example 1 was obtained.

Method for Preparing Compound of Comparative Example 1

A germanium oxide ($GeO_2$) powder was dissolved in a mixture of a hydriodic acid solution (a concentration of 55%) and a phosphinic acid solution (a concentration of 33%) so as to give a concentration of 0.125 mol/L. This solution was left in such a state that this solution was heated to 100° C. with a hotplate, whereby a yellow liquid (Ge-containing solution) was obtained.

Next, a powder of cesium iodide (CsI) was mixed with the Ge-containing solution heated to 100° C. so as to give a concentration of 0.125 mol/L. Reaction occurred immediately after mixing, so that black particles were precipitated in a liquid. The particles were washed with ethanol and were then dried, whereby the compound of Comparative Example 1 was obtained.

Measurement of Absorbance

The compounds of Example 1 and Comparative Example 1 were measured for absorbance, followed by determining the band gap of a light-absorbing material from an obtained absorption edge.

Figure 3:
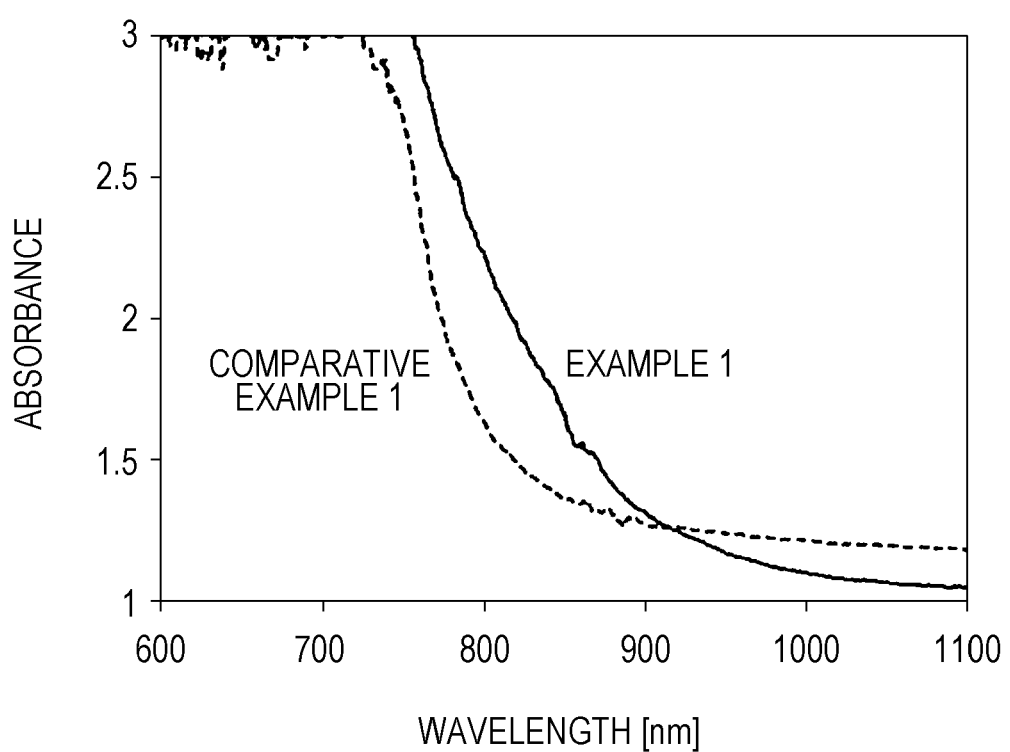
FIG. 3 is a graph showing an absorption spectrum of a compound of each of Example 1 and Comparative Example 1.

FIG. 3 is a graph showing an absorption spectrum of the compound of each of Example 1 and Comparative Example 1. In FIG. 3, the horizontal axis represents the wavelength of light and the vertical axis represents the absorbance. The absorption spectrum of the compound of Example 1 is drawn with a solid line. The absorption spectrum of the compound of Comparative Example 1 is drawn with a broken line.

From results shown in FIG. 3, it can be confirmed that the compound of Example 1 has an absorption edge greater than that of the compound of Comparative Example 1.

The band gap of the compound of Example 1 was derived from the results, resulting in 1.45 eV. Likewise, the band gap of the compound of Comparative Example 1 was derived, resulting in 1.58 eV. Thus, it became clear that the compound of Example 1 had a band gap smaller than that of the compound of Comparative Example 1 and was capable of absorbing light with a longer wavelength.

It is noted that the inventor repeated the preparation and analysis of a compound by the same methods as the above, while only the results of the compounds of the Example 1 and Comparative Example 1 are shown herein. As a result, it became clear that compounds prepared by mixing a solution of the Cs source with the Ge-containing solution could have a band gap of 1.45 eV or more and 1.48 eV or less, with variations depending on a synthesis environment and a synthesis time. On the other hand, it became clear that compounds prepared by mixing a powder of the Cs source with the Ge-containing solution had a band gap of 1.54 eV or more and 1.60 eV or less, with variations depending on a synthesis environment and a synthesis time. Thus, it was confirmed that a band gap smaller than that of conventional $CsGeI_3$ could be obtained by preparing the Cs source solution.

Measurement of X-Ray Diffraction

The compounds of Example 1 and Comparative Example 1 were measured by X-ray diffraction using Cu Kα radiation.

Figure 4:
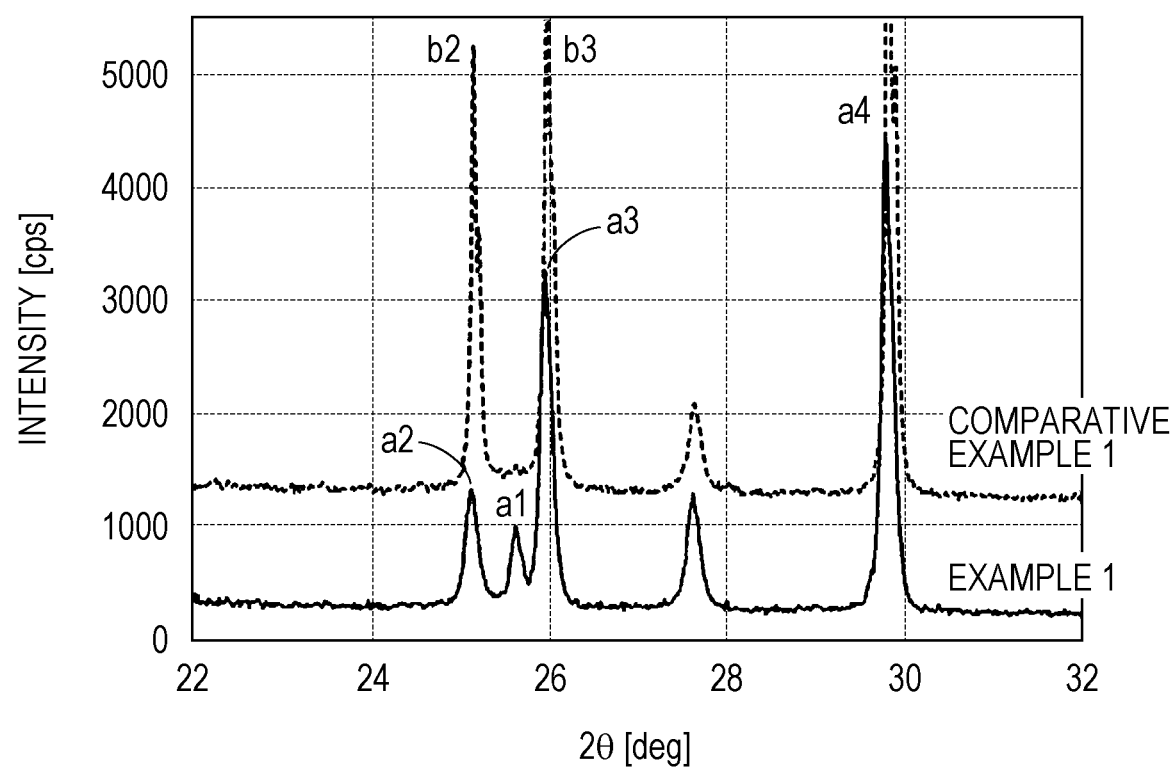
FIG. 4 is a graph showing an X-ray diffraction pattern of a compound of each of Example 1 and Comparative Example 1.

FIG. 4 is a graph showing an X-ray diffraction pattern of the compound of each of Example 1 and Comparative Example 1. In FIG. 4, the horizontal axis represents the diffraction angle (2θ) and the vertical axis represents the diffraction intensity. The X-ray diffraction pattern of the compound of Example 1 is drawn with a solid line. The X-ray diffraction pattern of the compound of Comparative Example 1 is drawn with a broken line.

As shown in FIG. 4, the X-ray diffraction pattern of the compound of Example 1 has a first peak a1 which is located at a diffraction angle (2θ) of 25.4° or more and 25.8° or less and which is assigned to the (111) plane of orthorhombic $CsGeI_3$, a second peak a2 which is located at a diffraction angle (2θ) of 24.9° or more and 25.3° or less and which is assigned to the (111) plane of rhombohedral $CsGeI_3$, and a third peak a3 assigned to the (−111) plane of rhombohedral $CsGeI_3$. The intensity of the first peak a1 is about 68% of the intensity of the second peak a2. This result shows that in the compound of Example 1, orthorhombic $CsGeI_3$ and rhombohedral $CsGeI_3$ are present in a mixed state. A relatively large peak a4 detected at a diffraction angle (2θ) of about 30° is due to unreacted CsI.

On the other hand, the X-ray diffraction pattern of the compound of Comparative Example 1 has a second peak b2 which is located at a diffraction angle (2θ) of 24.9° or more and 25.3° or less and which is assigned to the (111) plane of rhombohedral $CsGeI_3$ and a third peak b3 assigned to the (−111) plane of rhombohedral $CsGeI_3$ and lacks a peak (first peak) at a diffraction angle (2θ) of 25.4° or more and 25.8° or less. Thus, it is confirmed that the compound of Comparative Example 1 contains rhombohedral $CsGeI_3$ and does not contain orthorhombic $CsGeI_3$.

A light-absorbing material according to an embodiment of the present disclosure is useful as a material for use in light-absorbing layers of solar cells. The light-absorbing material can be applied to a material for use in devices interconverting light and electricity.

What is claimed is:

1. A method for producing a light-absorbing material, the method comprising:
   providing a first solution containing $Ge^{2+}$ ions, $I^-$ ions, hydriodic acid, and phosphinic acid at a predetermined temperature, wherein the first solution contains germanium diiodide or germanium oxide as a source of the $Ge^{2+}$ ions; and
   mixing the first solution with a second solution containing $Cs^+$ ions at the predetermined temperature to precipitate the light-absorbing material formed of a solid compound that is a mixture of:
      an orthorhombic perovskite-type compound represented by the formula $AMX_3$ where a $Cs^+$ ion is located at an A-site, a $Ge^{2+}$ ion is located at an M-site, and $I^-$ ions are located at X-sites, and
      a rhombohedral perovskite-type compound having a rhombohedral structure represented by the formula $AMX_3$ where a $Cs^+$ ion is located at an A-site, a $Ge^{2+}$ ion is located at an M-site, and $I^-$ ions are located at X-sites,
   wherein a bandgap of the light-absorbing material is 1.45 eV to 1.48 eV, and
   wherein the predetermined temperature is not less than 50 degrees Celsius and not more than 100 degrees Celsius when the first solution contains the germanium diiodide as the source of the $Ge^{2+}$ ions and the predetermined temperature is not less than 20 degrees Celsius and not more than 50 degrees Celsius when the first solution contains the germanium oxide as the source of the $Ge^{2+}$ ions.

2. The method according to claim 1, wherein the first solution is an organic solvent.

3. The method according to claim 1, wherein
the first solution contains the germanium diiodide as the source of the $Ge^{2+}$ ions.

4. The method according to claim 1, wherein
the first solution contains the germanium oxide as the source of the $Ge^{2+}$ ions.

5. The method according to claim 1, wherein the second solution is an organic solvent.

6. The method according to claim 5, wherein the second solution contains cesium iodide.

* * * * *